US005563769A

United States Patent [19]
MacGregor

[11] Patent Number: 5,563,769
[45] Date of Patent: Oct. 8, 1996

[54] TABBED COVER ATTACH FOR PCMCIA CARD PACKAGING AND METHOD FOR ATTACHING THE PCMCIA COVERS TO THE PRINTED CIRCUIT BOARD ASSEMBLY

[75] Inventor: Duncan MacGregor, Shingle Springs, Calif.

[73] Assignee: Intel Corporation, Santa Clara, Calif.

[21] Appl. No.: 277,147

[22] Filed: Jul. 19, 1994

[51] Int. Cl.⁶ ........................................... H05K 1/14
[52] U.S. Cl. .................... 361/737; 361/732; 361/752; 361/759; 257/679
[58] Field of Search .................. 361/737, 730, 361/732, 736, 752, 759, 796; 257/679; 235/441, 486, 487, 492; 365/52; 206/328–331; 439/44, 74

[56] References Cited

U.S. PATENT DOCUMENTS

| Re. 34,369 | 9/1993 | Darden et al. . |
| 4,530,069 | 7/1985 | Desrochers . |
| 4,695,925 | 9/1987 | Kodai et al. . |
| 4,811,165 | 3/1989 | Currier et al. . |
| 4,951,280 | 8/1990 | McCool et al. . |
| 5,183,404 | 2/1993 | Aldous et al. . |
| 5,184,282 | 2/1993 | Kaneda et al. . |
| 5,207,586 | 5/1993 | MacGregor et al. . |
| 5,242,310 | 9/1993 | Leung ........................................ 439/76 |
| 5,272,477 | 12/1993 | Tashima et al. . |
| 5,285,057 | 2/1994 | Murohara . |
| 5,296,692 | 3/1994 | Shino . |
| 5,296,850 | 3/1994 | King . |
| 5,303,121 | 4/1994 | Thornberg . |
| 5,313,364 | 5/1994 | Omori et al. . |
| 5,330,360 | 7/1994 | Marsh et al. ............................... 439/76 |
| 5,402,095 | 3/1995 | Janniere ..................................... 235/441 |

OTHER PUBLICATIONS

No Author, *PCMCIA, Personal Computer Memory Card International Association PC Card Standard Release 2.0*, 3–13 through 3–26 (Sep. 1991).
No Author, *PCMCIA, Recommended Extensions, Release 1.00*, 1–3 through 1–8 (1992).
No Author, *Miu Industries Ltd.*, Company Overview, pp. 1 through 3 (1994).
No Author, *The Session Key Data Security Solution*, Company Brochure.

*Primary Examiner*—Gerald P. Tolin
*Assistant Examiner*—Y. Whang
*Attorney, Agent, or Firm*—Blakely, Sokoloff, Taylor & Zafman

[57] ABSTRACT

The present invention relates to electronic packaging for PC Cards, and more particularly to attaching the PC Card covers to the printed circuit board and frame. The purpose of the present invention is to provide a PC card assembly comprising of a printed circuit board coupled to the frame and attached to a bottom cover and a top cover by tabs in the bottom cover. The present invention also provides a method of assembling the PC Cards such that the tabs in the bottom cover are inserted into the through openings in the frame. These inserted tabs are then bonded to the top cover, creating a very rigid assembly and providing a very fast manufacturing process throughput.

7 Claims, 4 Drawing Sheets

Type I PC Card
3.3 mm Thick

Type II PC Card
5.0 mm Thick

Type III PC Card
10.5 mm Thick

TABBED COVER ATTACH FOR PCMCIA CARD PACKAGING AND METHOD FOR ATTACHING THE PCMCIA COVERS TO THE PRINTED CIRCUIT BOARD ASSEMBLY

BACKGROUND

The present invention relates to electronic packaging for PC Cards, and more particularly to attaching PC Card covers to printed circuit boards and frames.

Typically, each PC Card consists of a printed circuit board and a frame which is enclosed by either a stamped sheet metal or a plastic material. The covering is used to protect the electronic circuitry on the printed circuit board. Referring to FIG. 1, at one end the PC Cards have a 68 pin connector 11 for attachment to a computer. Some of these cards may have another connector 12 at the opposite end to allow the computer to be coupled to an external device. Such a connector is commonly found on internal modems or facsimile cards.

As computer systems have continued to be downsized, internal spatial restrictions have required the establishment of standards for the internal accessories of the computer. The Personal Computer Memory Card International Association ("PCMCIA"), comprised of hundreds of manufacturers of memory cards and related peripheral equipment, has established PC Card standards defining the PC Card's physical outline standards, connector system and qualification test parameters, including reliability, durability and environmental test parameters. The latest PCMCIA standard, release 2.01 is incorporated here by reference. PC Cards are a key technology for adding memory, storage, and Input/Output capabilities to portable computer systems and can be used with any personal potable computer system equipped with a PCMCIA slot, including laptops, notebooks, palmtops, and tablets.

The PCMCIA has determined that the spatial standards of all PC Cards used in down-sized computers should be restricted to a rectangular space approximately 55 millimeters in width and 85 millimeters in length, which is about the size and shape of a "credit" card. The PCMCIA specifications further define the thickness of the PC Cards as one of the following types: Type 1, Type II, or Type III. The thicknesses for Type I, Type II, and Type II are 3.3, 5.0, and 10.5 millimeters respectively (see FIGS. 2A, 2B and 2C).

A Type I PC Card is typically used for various types of memory enhancements, including RAM, FLASH memory, one-time programmable memory, and electronically erasable programmable read only memory. A Type II PC Card is typically used for memory enhancements and/or for Input/Output features such as modems, LANs and host communications. A Type III PC Card is twice the thickness of the Type II and is typically used for memory enhancements and/or for Input/Output features that require a larger size, such as rotating mass storage devices and radio communication devices. Since Type I, Type II and Type II Cards all use the same interface, the size of the card chosen for the application is dependent on the miniaturization of the technology to be implemented.

In the past, the stringent qualification test parameters defined by PCMCIA in Section 3 of the Card Physical have placed limitations on the types of methods used to attach the covers of the cards to the printed circuit board and frame. The key is to provide a cover that is rugged enough to withstand the qualification and reliability testing, while being cost efficient from the manufacturing standpoint. Currently available methods of attaching the cover to the printed circuit board and frame includes both adhesive and adhesiveless solutions. The adhesive solution provides several alternative methods of attachment such as a pressure sensitive adhesive which is similar to the back of a sticky label, or a thermoplastic adhesive, both of these methods require heat and pressure to apply the adhesive. Another method of attachment is to apply a liquid adhesive such as an epoxy. However, this method incorporates a long dispense and cure cycle to set the adhesive, and furthermore requires very close process monitors.

Several adhesiveless solutions are also available today. Rather than using an adhesive, the attachment method may be designed into the cover and frame such that the cover snaps into the frame with small latches. While this solution is economical from the manufacturing standpoint, it does not satisfy the rigidity requirement set forth by the PCMCIA standards. Another adhesiveless method is to wrap the cover around the perimeter of the card such that the bottom cover and the top cover touch around the perimeter of the frame and are welded together. This solution provides a very strong assembly between the printed circuit board, frame, and cover, however, the equipment necessary for this process is very expensive due to the high tolerance required to assure the bottom and top covers touch around the entire perimeter of the card.

Therefore, it is desirable to provide an adhesiveless solution, which has a very fast manufacturing process throughput and is economical, yet complies with the PCMCIA standards for PC Cards.

BRIEF DESCRIPTION OF THE DRAWINGS

The objects, features, and advantages of the present invention will be apparent from the following detailed description of the preferred embodiment of the invention with references to the drawings in which.

SUMMARY OF THE PRESENT INVENTION

The present invention relates to electronic packaging for PC Cards that comply with the standards set forth by PCMCIA. The general purpose of the invention is to provide a protective covering for a printed circuit board consisting of a tabbed cover attach, and also to provide a fast, economical method for assembling the tabbed cover attach to the printed circuit board.

Figure 1:
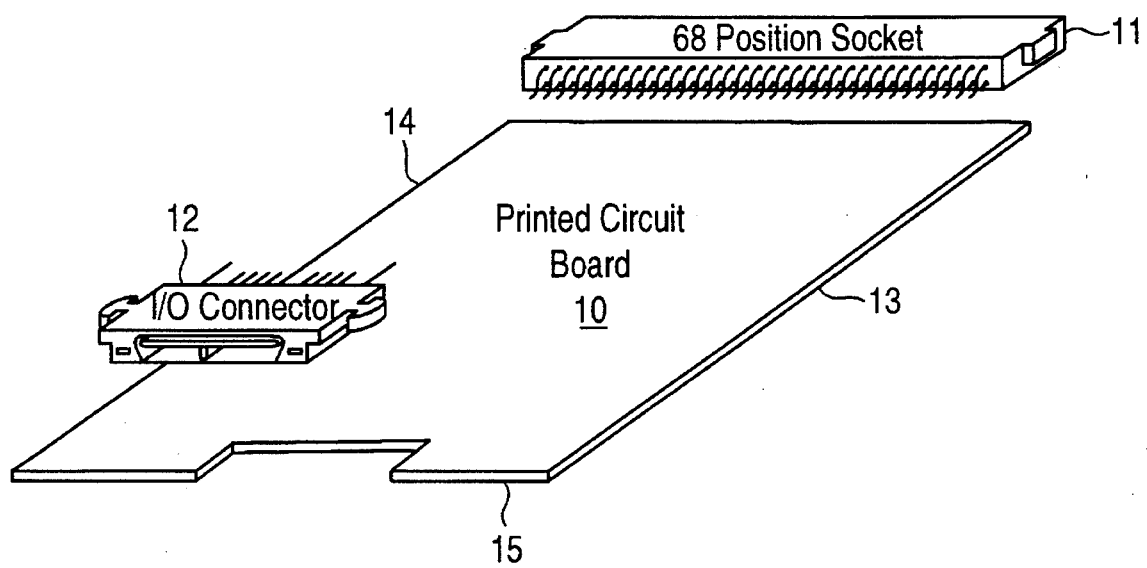
FIG. 1 illustrates a printed circuit board and connectors.
Figure 2A:
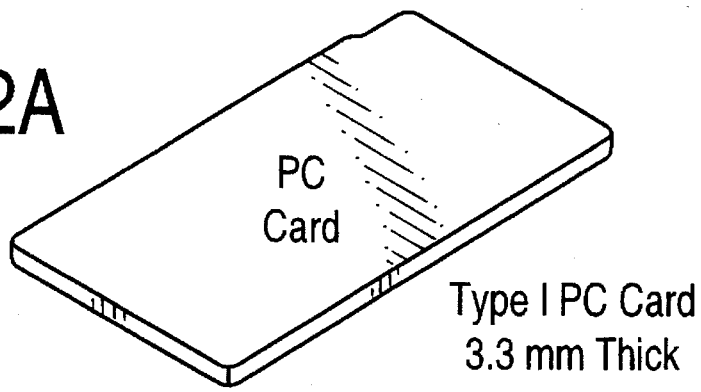
FIG. 2A illustrates a Type I PC Card.
Figure 2B:
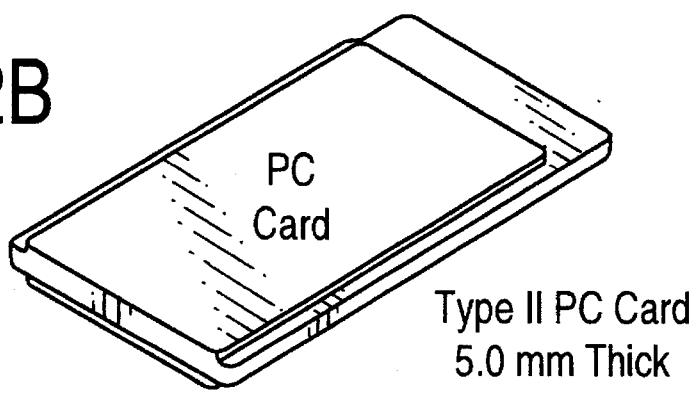
FIG. 2B illustrates a Type II PC Card.
Figure 2C:
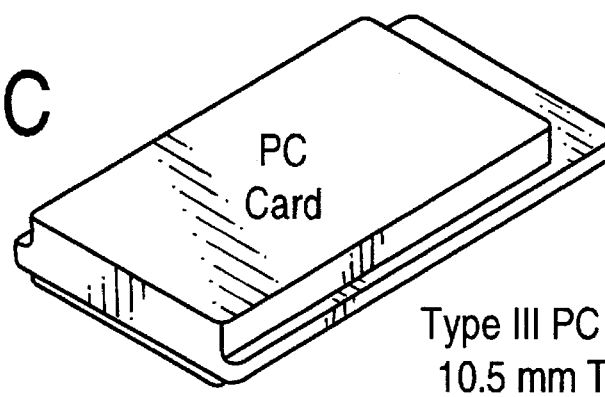
FIG. 2C illustrates a Type III PC Card.
Figure 3:
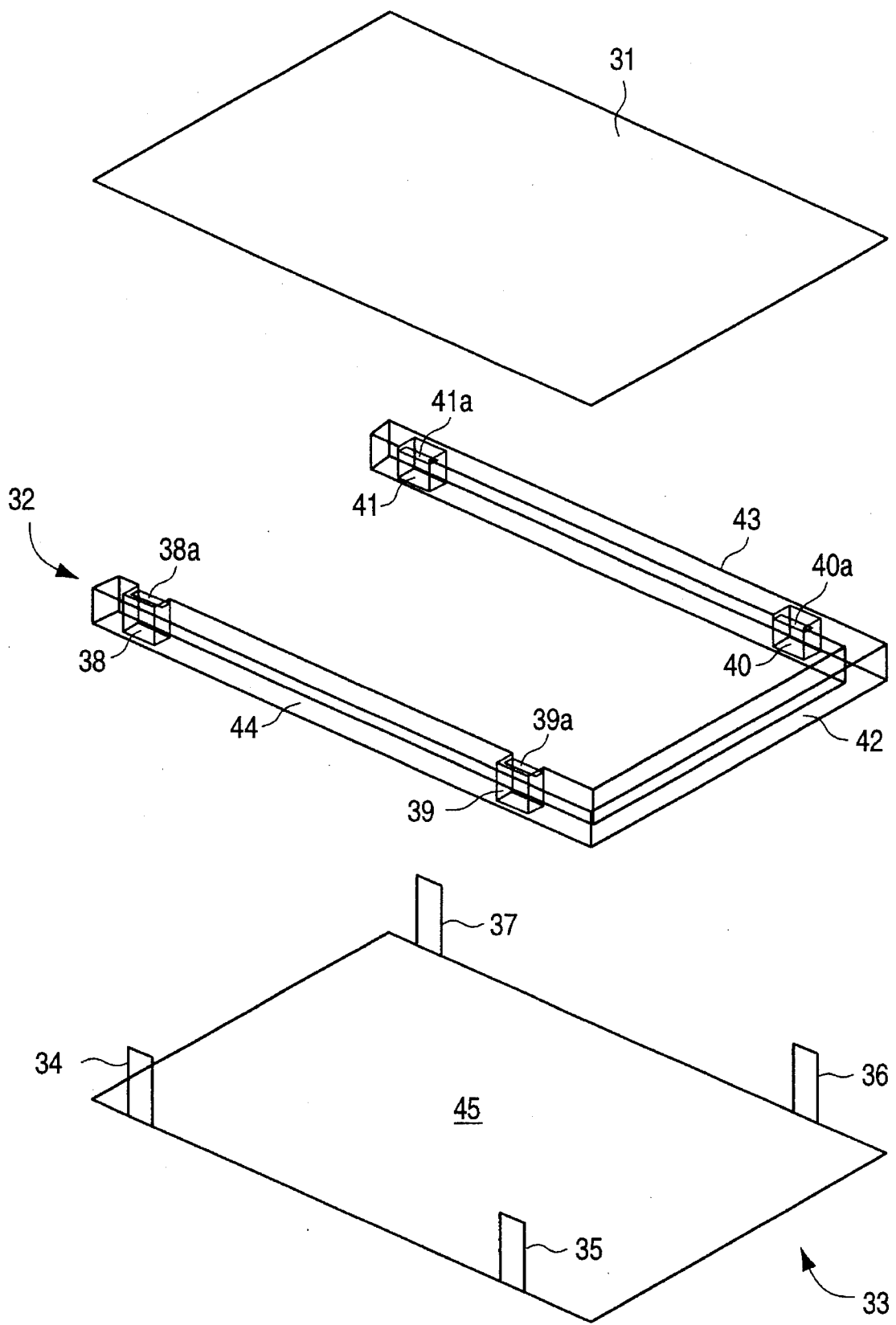
FIG. 3 illustrates a tabbed cover attach for PC card packaging.

The essential elements of the tabbed cover attach are shown in FIG. 3 and includes a frame 32, a bottom cover 33, and a top cover 31. The top cover is used to enclose the top surface of the printed circuit board 10 shown in FIG. 1, and the bottom cover is used to enclose the bottom surface of printed circuit board 10. The frame attaches to the outer edges of the printed circuit board such that tabs in the bottom cover can be inserted through through openings in the frame and then bonded to the top cover. When the top cover, bottom cover, and frame are attached together, they provide a protective covering for the printed circuit board.

It is desirable, from a manufacturing standpoint, to design a cover that provides an adhesiveless solution. An adhesiveless solution eliminates the long dispense and cure cycle necessary to set the adhesive and furthermore, reduces to need for close process monitoring.

It is also desirable to provide a fast, economical means of attaching the covers of a PCMCIA card to the printed circuit board and frame, while satisfying the PCMCIA spatial requirements and qualification and reliability criteria. This can be accomplished by using various internal metal-to-metal bonds, such as welding, ultrasonics or specific metal-to-metal adhesives.

The overall advantage of this solution is to provide very fast process throughput, thereby saving process and material costs in the manufacturing of the PC Cards in compliance with the PCMCIA standards.

DETAILED DESCRIPTION OF THE INVENTION

This description is given for the purpose of describing the general principles of the invention and is not to be taken in a limiting sense. The true scope of the invention should be determined with reference to the appended claims.

The purpose of the present invention is to provide an apparatus to protect and cover a printed circuit board with a tabbed cover attach. Also, the purpose of the present invention is to provide a method to assemble the printed circuit board with its protective covering to manufacture PC cards. The PC cards manufactured must comply with the PCMCIA standards, adhering to both the spatial specifications and qualification and reliability test requirements.

In the present invention, the apparatus to protect and cover printed circuit board 10 is shown in FIG. 3. The essential elements in the tabbed cover attach include a frame 32, a top cover 31, and a bottom cover 33 with tabs. In order to appreciate and better understand the present invention, refer back to FIG. 1 which illustrates a printed circuit board 10 along with the 68 pin connector 11 and Input/Output connector 12. For the purposes of the present invention, the connectors exist separately from the present invention, thus are not included as part of the present invention.

Top cover 31 and bottom cover 33 are usually made out of stamped sheet metal or some type of plastic material. Top cover 31 is used to enclose the top surface of printed circuit board 10 and bottom cover 33, which includes tabs, is used to enclose the bottom surface of printed circuit board 10. When top cover 31, bottom cover 33, and frame 32 are attached together with the tabs, they provide a protective covering for printed circuit board 10. The use of the tabs allows top cover 31, bottom cover 33, and frame 32 to be attached by an internal metal-to-metal bond such as welding, ultrasonics, or specific metal-to-metal adhesives. An advantage of this type of packaging is that a stronger bond can be made between the same types of material (e.g. metal-to-metal) than one between two different types of material (e.g. metal-to-plastic). This feature will become more apparent from the discussion below.

Frame 32 has an end section 42 that is adjacent end section 15 of printed circuit board 10, and a pair of edges 43 and 44 extending from end section 42 of frame 32 and adjacent to edge 13 and 14 of printed circuit board 10. Frame 32 also includes a plurality of through openings labeled 38, 39, 40, and 41. A typical frame structure may include 3 through openings on each of the edges 43 and 44, and 2 through openings on end section 42.

Bottom cover 33 includes a main portion 45 and a plurality of tabs 34, 35, 36, and 37 which are substantially perpendicular to main portion 45. Each tab in the bottom cover has a corresponding through opening in frame 32 such that each tab can be inserted into its corresponding through opening. In FIG. 3, tab 34 corresponds to through opening 38, tab 35 corresponds to through opening 39, tab 37 corresponds to through opening 41, and tab 36 corresponds to through opening 40. Once tabs 34, 35, 36, and 37 are inserted into their corresponding through openings, the exposed portion of each tab is folded over flat into "the corresponding notches 38a, 39a, 40a, and 41a in the frame". Top cover 31 is then bonded to the exposed portion of each tab in the manner discussed above.

Figure 4:
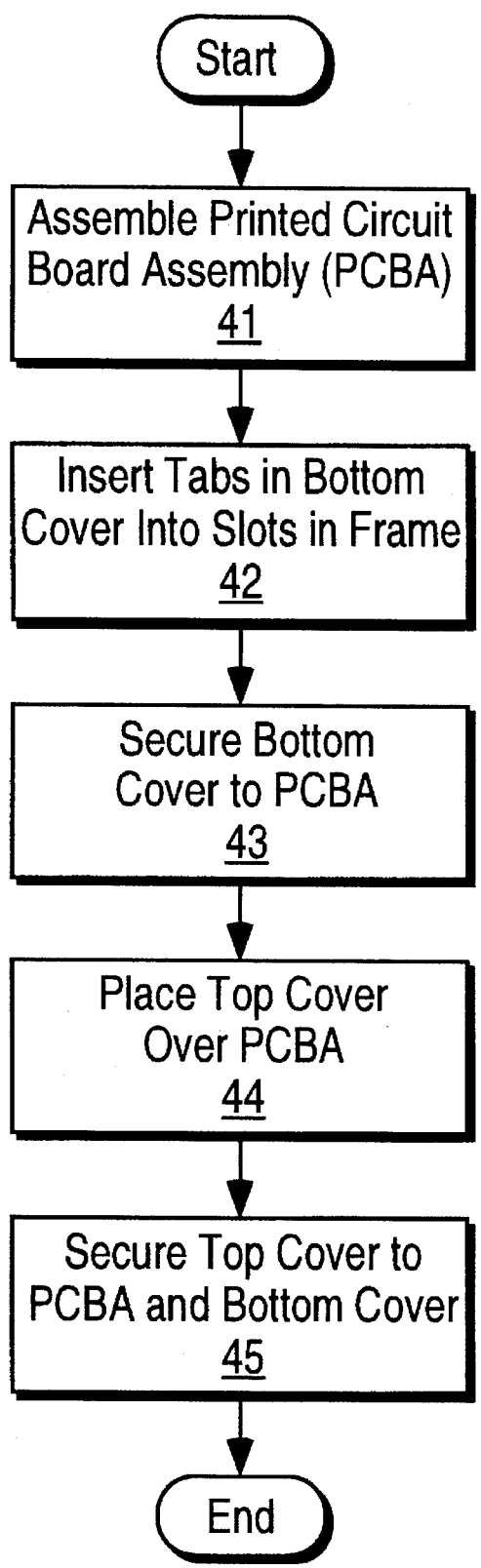
FIG. 4 is a flowchart that describes the steps to assemble PC Cards that are packaged in the tabbed cover attach.

In the present invention, a method to manufacture PC Cards includes the following steps. Referring to the flowchart in FIG. 4, the first step is to assemble printed circuit board 10 and frame 32 into a printed circuit board assembly as shown by box 41. The next step, illustrated by box 42, is to insert each tab in the bottom cover into its corresponding through opening in frame 32. Then, secure bottom cover 33 to the printed circuit board assembly by folding over the exposed portion of each tab flat into its corresponding notch in the frame as shown by box 43. However, if the tabs are designed such that the length of the tab is approximately equal to the thickness of frame 32, then the exposed portion of each tab may not need to be folded over flat. The fourth step is to place top cover 31 over the printed circuit board assembly, as shown in box 44. The last step, illustrated by box 45, is to secure top cover 31 to the printed circuit board assembly and bottom cover 33 by bonding top cover 31 to the exposed portion of each tab that has been folded over into a corresponding notch in the frame.

What is claimed is:

1. An electronic card assembly, comprising:

a printed circuit board having a first surface and a second surface;

a frame coupled to said printed circuit board, said frame having a plurality of through openings;

a first cover having a main portion and a plurality of tabs substantially perpendicular to said main portion, said plurality of tabs being inserted through said plurality of through openings in said frame, said first cover used to enclose said first surface of said printed circuit board;

a second cover attached to a portion of said plurality of tabs extending through said plurality of through openings, said second cover used to enclose said second surface of said printed circuit board.

2. The electronic card assembly as claimed in claim 1, wherein each of said plurality of tabs in said first cover has a corresponding one of said plurality of through openings in said frame such that each of said plurality of tabs in said first cover is inserted into said corresponding one of said plurality of through openings in said frame.

3. The electronic card assembly as claimed in claim 1, wherein each of said plurality of through openings has a corresponding notch in said frame such that a portion of each of said plurality of tabs extended through said plurality of tabs is folded over flat into said notch once each of said plurality of tabs in said first cover is inserted into said corresponding one of said plurality of through openings in said frame.

4. The electronic card assembly as claimed in claim 1, wherein attaching said second cover to said exposed portion of said plurality of tabs extended through said through opening includes a metal-to-metal bond.

5. A method of assembling an electronic card, said method comprising the steps of:
   a) assembling a printed circuit board and a frame into a printed circuit board assembly;
   b) inserting a plurality of tabs from a first cover into a corresponding through opening in said frame of said printed circuit board assembly;
   c) placing said second cover over said printed circuit board assembly; and
   d) attaching said second cover to an exposed portion of said plurality of tabs extended through said through opening such that said second cover is secured to said circuit board assembly and said first cover.

6. The method of claim 5, wherein said second cover is attached to said exposed portion of said plurality of tabs extended through said through opening with a metal-to-metal bond.

7. The method of claim 5, wherein step d further comprises the step of folding over said exposed portion of each of said plurality of tabs extended through said through opening into a corresponding notch in said frame thereby securing said first cover to said printed circuit board assembly.

* * * * *

UNITED STATES PATENT AND TRADEMARK OFFICE
CERTIFICATE OF CORRECTION

PATENT NO.    : 5,563,769
DATED         : October 8, 1996
INVENTOR(S)   : Duncan MacGregor It is certified that error appears in the above-identified patent and that said Letters Patent is hereby corrected as shown below:

In column 1 at line 35 delete "potable" and insert --portable--

Signed and Sealed this

Eleventh Day of February, 1997

Attest:

*Attesting Officer*

BRUCE LEHMAN

*Commissioner of Patents and Trademarks*